(12) United States Patent
Gstrein et al.

(10) Patent No.: US 12,341,061 B2
(45) Date of Patent: Jun. 24, 2025

(54) BOTTOM-UP FILL DIELECTRIC MATERIALS FOR SEMICONDUCTOR STRUCTURE FABRICATION AND THEIR METHODS OF FABRICATION

(71) Applicant: Intel Corporation, Santa Clara, CA (US)

(72) Inventors: Florian Gstrein, Portland, OR (US); Rami Hourani, Portland, OR (US); Gopinath Bhimarasetti, Portland, OR (US); James M. Blackwell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 666 days.

(21) Appl. No.: 17/549,831

(22) Filed: Dec. 13, 2021

(65) Prior Publication Data
US 2022/0102207 A1    Mar. 31, 2022

Related U.S. Application Data

(62) Division of application No. 16/346,256, filed as application No. PCT/US2016/068578 on Dec. 23, 2016, now Pat. No. 11,232,980.

(51) Int. Cl.
*H01L 21/768*    (2006.01)
*H01L 21/033*    (2006.01)
(Continued)

(52) U.S. Cl.
CPC .... *H01L 21/76837* (2013.01); *H01L 21/0337* (2013.01); *H01L 21/3086* (2013.01);
(Continued)

(58) Field of Classification Search
CPC .......... H01L 21/3086; H01L 21/76831; H01L 23/528; H01L 21/76837
See application file for complete search history.

(56) References Cited

U.S. PATENT DOCUMENTS

| 2001/0021581 A1 | 9/2001 | Moon et al. |
| 2006/0043456 A1 | 3/2006 | Derderian et al. |

(Continued)

OTHER PUBLICATIONS

International Preliminary Report on Patentability for International Patent Application No. PCT/US2016/068578 mailed Jul. 4, 2019, 8 pgs.

*Primary Examiner* — Moazzam Hossain
*Assistant Examiner* — Hajar Kolahdouzan
(74) *Attorney, Agent, or Firm* — Schwabe, Williamson & Wyatt P.C.

(57) ABSTRACT

Bottom-up fill dielectric materials for semiconductor structure fabrication, and methods of fabricating bottom-up fill dielectric materials for semiconductor structure fabrication, are described. In an example, a method of fabricating a dielectric material for semiconductor structure fabrication includes forming a trench in a material layer above a substrate. A blocking layer is formed partially into the trench along upper portions of sidewalls of the trench. A dielectric layer is formed filling a bottom portion of the trench with a dielectric material up to the blocking layer. The blocking layer is removed. The forming the blocking layer, the forming the dielectric layer, and the removing the blocking layer are repeated until the trench is completely filled with the dielectric material.

20 Claims, 13 Drawing Sheets

(51) Int. Cl.
*H01L 21/308* (2006.01)
*H01L 23/528* (2006.01)
*H01L 21/02* (2006.01)
*H01L 23/522* (2006.01)

(52) U.S. Cl.
CPC .. *H01L 21/76811* (2013.01); *H01L 21/76813* (2013.01); *H01L 21/76816* (2013.01); *H01L 21/76831* (2013.01); *H01L 21/76834* (2013.01); *H01L 21/76897* (2013.01); *H01L 23/528* (2013.01); *H01L 21/02252* (2013.01); *H01L 21/0228* (2013.01); *H01L 21/76883* (2013.01); *H01L 23/5226* (2013.01)

(56) References Cited

U.S. PATENT DOCUMENTS

| | | | |
|---|---|---|---|
| 2008/0160718 A1* | 7/2008 | Lee | H01L 21/76232 438/425 |
| 2009/0280649 A1 | 11/2009 | Mayer | |
| 2011/0101435 A1 | 5/2011 | Jung | |
| 2012/0190169 A1* | 7/2012 | Chin | H01L 21/76232 257/E21.546 |
| 2015/0171009 A1* | 6/2015 | Bristol | H01L 21/76897 257/774 |
| 2015/0171010 A1 | 6/2015 | Bristol et al. | |
| 2015/0179513 A1 | 6/2015 | Myers et al. | |
| 2016/0099174 A1 | 4/2016 | Wu | |
| 2017/0062217 A1 | 3/2017 | Park | |
| 2017/0229341 A1* | 8/2017 | Chang | H01L 23/528 |

\* cited by examiner

BOTTOM-UP FILL DIELECTRIC MATERIALS FOR SEMICONDUCTOR STRUCTURE FABRICATION AND THEIR METHODS OF FABRICATION

CROSS-REFERENCE TO RELATED APPLICATION

This patent application is divisional of U.S. patent application Ser. No. 16/346,256, filed Apr. 30, 2019, which is a U.S. National Phase Application under 35 U.S.C. § 371 of International Application No. PCT/US2016/068578, filed Dec. 23, 2016, entitled "BOTTOM-UP FILL DIELECTRIC MATERIALS FOR SEMICONDUCTOR STRUCTURE FABRICATION AND THEIR METHODS OF FABRICATION," which designates the United States of America, the entire disclosures of which are hereby incorporated by reference in their entirety and for all purposes.

TECHNICAL FIELD

Embodiments of the disclosure are in the field of semiconductor structures and processing and, in particular, bottom-up fill dielectric materials for semiconductor structure fabrication and methods of fabricating bottom-up fill dielectric materials for semiconductor structure fabrication.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias.

When patterning extremely small vias with extremely small pitches by such lithographic processes, several challenges present themselves, especially when the pitches are around 70 nanometers (nm) or less and/or when the critical dimensions of the via openings are around 35 nm or less. One such challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up.

Another such challenge is that the critical dimensions of the via openings generally tend to scale faster than the resolution capabilities of the lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing. A further such challenge is that the extremely small via pitches generally tend to be below the resolution capabilities of even extreme ultraviolet (EUV) lithographic scanners. As a result, commonly two, three, or more different lithographic masks may be used, which tend to increase the costs. At some point, if pitches continue to decrease, it may not be possible, even with multiple masks, to print via openings for these extremely small pitches using EUV scanners.

DESCRIPTION OF THE EMBODIMENTS

Figure 1:
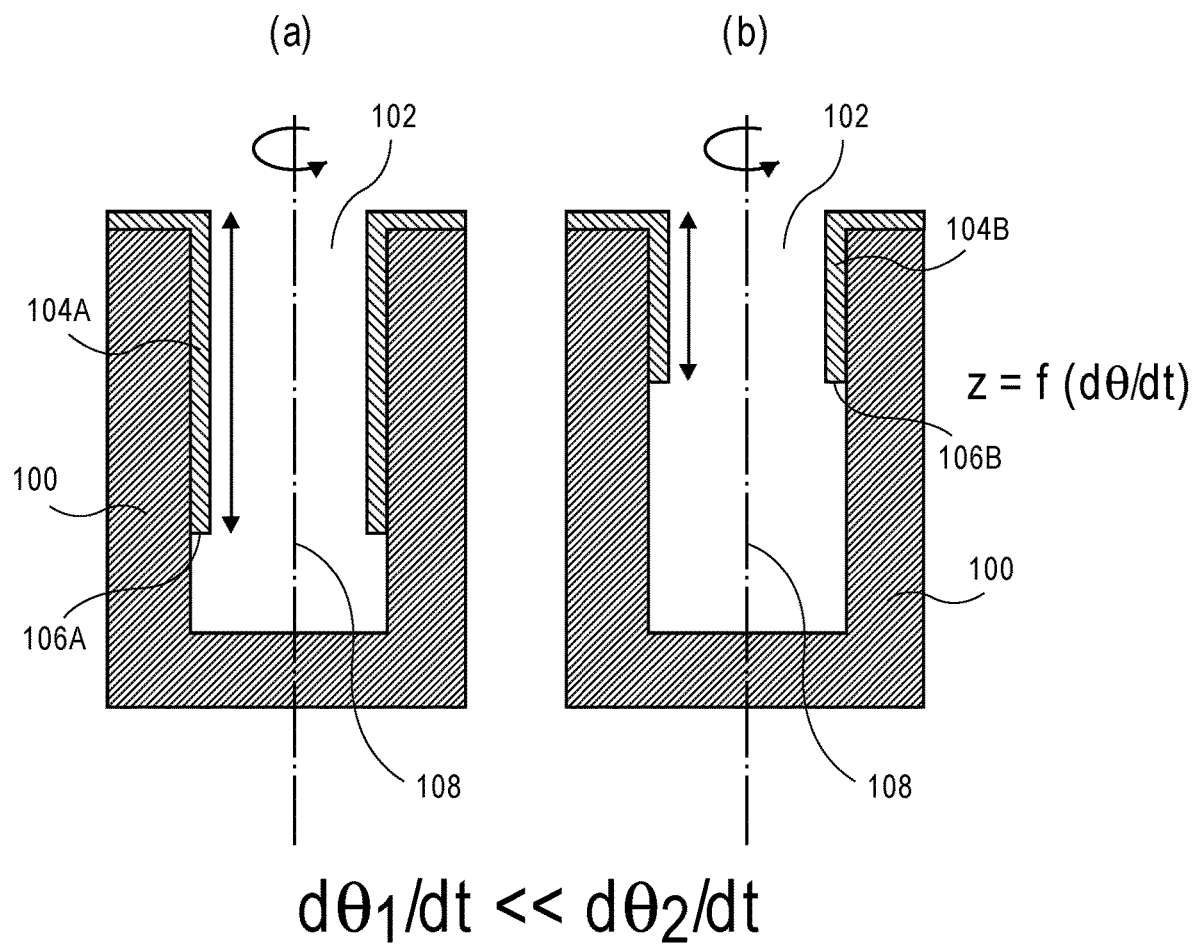
FIG. 1 illustrates two examples of a trench in a layer having a layer formed to different depths within the trench as a function of angular velocity, in accordance with an embodiment of the present disclosure.

Bottom-up fill dielectric materials for semiconductor structure fabrication, and methods of fabricating bottom-up fill dielectric materials for semiconductor structure fabrication, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments are directed to fabrication of a material layer, such as a hardmask layer, having dual etch properties or characteristics. Embodiments described herein may be implemented to enable patterning techniques for fabricating semiconductor devices or structures having a pitch or 40 nanometers (40 nm) or less. Embodiments described herein may be implemented to enable patterning techniques for fabricating semiconductor devices or structures having aspect ratios approximately in the range of 2:1 to 10:1 with top dimensions approximately in the range of 6-40 nanometers.

To provide context, filling of patterned trenches or holes becomes increasingly difficult when feature sizes shrink or aspect ratios increase. Conformal fill results in a seam that cannot be healed without applying extreme thermal conditions. Many fill processes actually have some degree of non-conformality due to a difference in deposition rate on the horizontal field compared to the perpendicular sidewall, which can result in an even more exaggerated seam or void. Additionally, accurate edge placement is a key patterning challenge for scaling. One way to control edge placement is to differentiate neighboring patterns with hardmask materials of unique etch selectivity, also referred to as colors. As vias and plugs are landed on such patterns the hardmask materials ensure that even with a large pattern placement error only the correct patterns are opened (via) or cut (plugs, or line ends).

In accordance with one or more embodiments described herein, one or more of the above issues is addressed using a bottom-up fill approach involving spatial atomic layer deposition (ALD). Embodiments may include bottom-up fill of high aspect ratio features, dielectric gapfill, passivants, self-assembled monolayers, or spatial atomic layer deposition. Embodiments may be implemented to achieve the coloring of patterns with hardmasks where high-aspect-ratio features are filled with hardmask materials without voids and with uniform etch properties.

To provide further context, hardmask materials with good gapfill properties such as spin on materials or flowable dielectrics typically have poor etch selectivity largely as a result of the incomplete conversion of the film into a hardmask material after gapfill. Alternatively, hardmask materials with good etch selectivity (e.g., CVD or ALD films) tend to suffer from fill voids due to the highly conformal nature of ALD or CVD process.

In an embodiment, bottom-up fill of an ALD process is induced by selectively blocking (e.g., suppressing or poisoning) deposition in the field (e.g., surfaces adjacent to a trench but not in a trench) and upper portions (e.g., upper regions of trench sidewall surfaces) of the high aspect ratio features to avoiding or at least mitigate the risk of trapping voids. In an embodiment, acceleration of deposition at the bottom portions of the high aspect ratio features is implement to enhance the selective blocking process, or can be used on its own.

In spatial ALD processes, a substrate or wafer rotates with a controllable angular velocity through a reaction chamber. The speed with which the wafer rotates controls how deeply reactants can penetrate into a high aspect ratio feature. As an example, FIG. 1 illustrates two examples of a trench in a layer having a layer formed to different depths within the trench as a function of angular velocity, in accordance with an embodiment of the present disclosure.

Referring to FIG. 1, part (a), a structure includes a trench 102 is formed in a layer 100, such as a dielectric layer. A blocking layer 104A (which may be referred to as a poisoning layer or a selection layer) is formed above the trench 102 and into the trench 102 to a depth 106A within the trench 102, e.g., along upper sidewall portions of the trench 102. The blocking layer 104A is formed during a deposition process performed while the structure is spinning around axis 108 at a rate of $d\theta 1/dt$, e.g., by spinning a wafer or substrate on which the structure is formed.

Referring to FIG. 1, part (b), a structure includes a trench 102 is formed in a layer 100, such as a dielectric layer. A blocking layer 104B (e.g., the same material as 104A) is formed above the trench 102 and into the trench 102 to a depth 106B within the trench 102, e.g., along upper sidewall portions of the trench 102. The blocking layer 104B is formed during a deposition process performed while the structure is spinning around axis 108 at a rate of $d\theta 2/dt$.

In accordance with an embodiment of the present disclosure, $d\theta 2/dt$ is much greater than $d\theta 1/dt$. As such, the depth of penetration (Z) of the blocking layer 104A or 104B in trench 102 is a function of $(d\theta/dt)$.

In an embodiment, the blocking layers 104A and 104B are formed by atomic layer deposition (ALD) and are or include a blocking agent such as an aliphatic hydrocarbon layer. In another embodiment, the blocking layers 104A and 104B are formed by a plasma exposure which chemically modifies the surface of the trench 102. In another embodiment, the blocking layers 104A and 104B are formed by a combination of plasma treatment followed by "static" (low angular speed) deposition of a blocking agent, such as an ALD-formed blocking agent.

Figure 2:
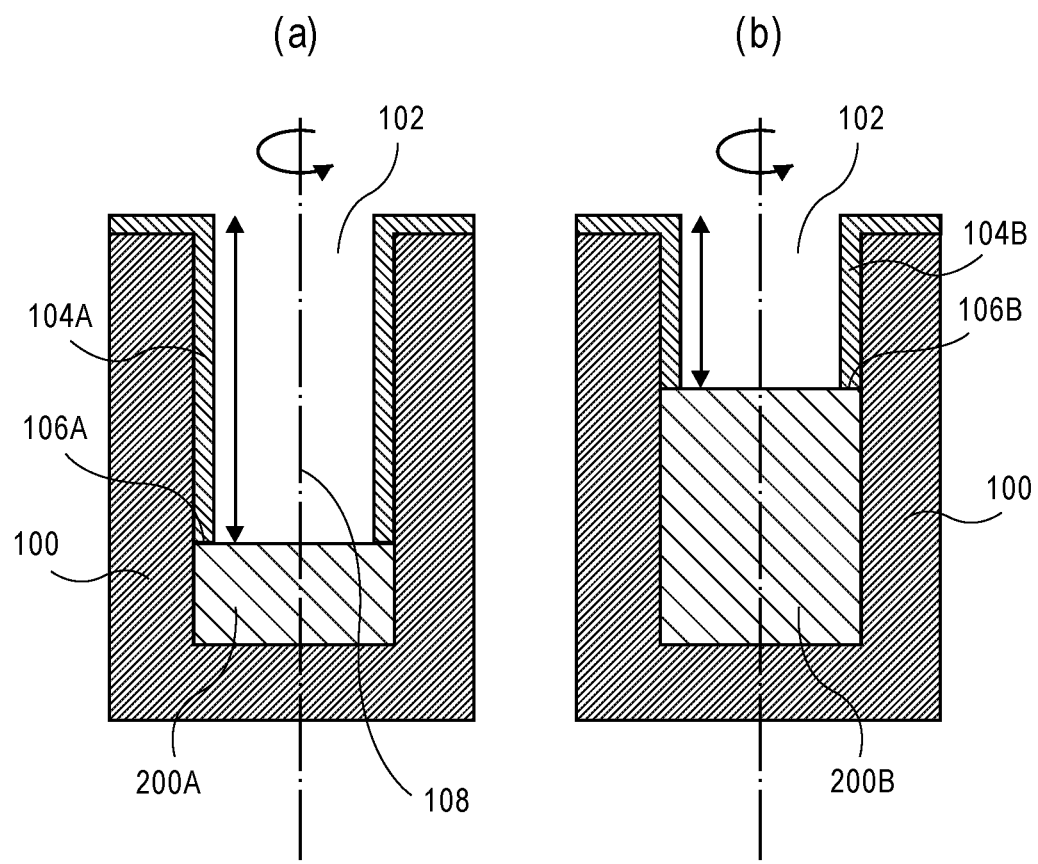
FIG. 2 illustrates two examples of a trench in a layer having a blocking or poisoning layer formed to different depths within the trench, and corresponding extents of bottom-up fill of a dielectric material, in accordance with an embodiment of the present disclosure.

FIG. 2 illustrates two examples of a trench in a layer having a blocking or poisoning layer formed to different depths within the trench, and corresponding extents of bottom-up fill of a dielectric material, in accordance with an embodiment of the present disclosure.

Referring to FIG. 2, part (a), the trench 102 of the structure of part (a) of FIG. 1 is partially filled with a dielectric material 200A. The dielectric material 200A is formed in a bottom-up fill deposition up until the block layer 104A at depth 106A. Referring to FIG. 2, part (b), the trench 102 of the structure of part (b) of FIG. 1 is partially filled with a dielectric material 200B. The dielectric material 200B is formed in a bottom-up fill deposition up until the block layer 104B at depth 106B.

In both cases (a) and (b) of FIG. 2, the layers 104A and 104B, respectively, block a thermal or plasma based atomic layer deposition used to form dielectric layers 200A and 200B. That is, the thermal or plasma based atomic layer deposition is permitted in the trench 102 only up to the depth 106A or 106B of the blocking layer 104A or 104B, respectively, in the trench 102. Accordingly, a bottom-up gap fill is achieved in a sequential process, with a blocking layer formed first and a fill dielectric layer formed second.

Referring collectively to the concepts of FIGS. 1 and 2, in an embodiment, a blocking agent (104A) is allowed to deeply diffuse in a high aspect ratio feature (102) at a low angular speed of a wafer on which the trench is formed. A dielectric material (200A) can only nucleate at the bottom and/or lower portion of the trench and is blocked on the sidewalls, particularly on upper portions of the sidewalls. The blocking agent 104A is then removed, e.g., by an ash process and/or a thermal process, and the original surface of the trench 102 is restored. The angular speed of the wafer is then increased. A blocking agent 104B, which may be the same material as 104A, now only diffuses into the upper portion of the feature, e.g., at a shallower depth. A second deposition of the dielectric material is performed to extend dielectric layer 200A to 200B, such that the height of the bottom-up fill dielectric material is increased within the trench 102. In an embodiment, such cycles (104/200) are repeated iteratively with ever increasing angular speed to ultimately achieve a void-free fill of the trench 102 with a dielectric material.

As described above, for many novel patterning techniques, a set of materials is needed with unique etch characteristics. Along with etch selectivity, such patterning flows may also require the materials to have the ability to uniformly fill features of various pitch and/or aspect ratios. Standard methods may be unable to meet this fill requirement. For example, chemical vapor deposition (CVD) based approaches tend to pinch off forming voids. On the other hand, ALD based approaches can fill features but leave a seam. Furthermore, spin-on techniques for non-porous films may have associated difficulties generating a fully cross-linked film in a narrow and/or high aspect ratio feature. The above approaches may also be hampered by associated non-uniform etch rates from a top of the structure to a bottom of the structure.

Embodiments described herein may be implemented enable the fabrication of etch resistant fill materials. It is to be appreciated that gap-fill in high aspect ratio features, especially as it relates to the gap-fill of dielectrics with strong etch selectivity, is considered one of the key challenges in patterning. In one aspect, a bottom-up fill dielectric material is implemented within the context of semiconductor structure fabrication. In an example, FIGS. 3A-3D illustrate cross-sectional views representing various operations in a method of fabricating a bottom-up fill dielectric material, in accordance with an embodiment of the present disclosure.

Figure 3A:
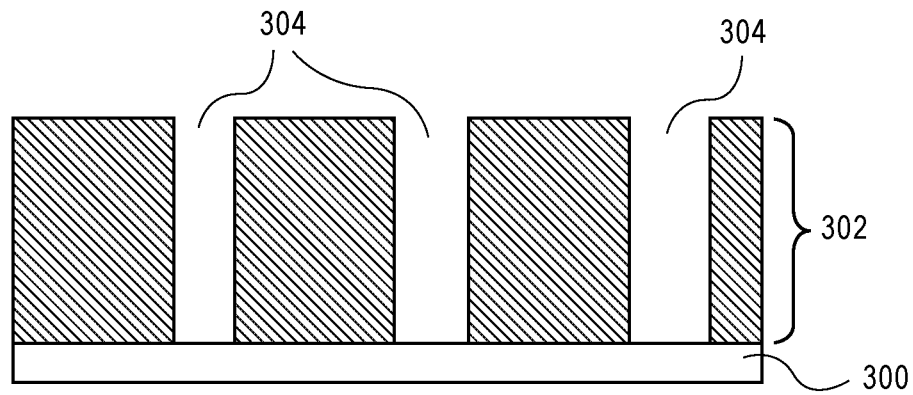
FIGS. 3A-3D illustrate cross-sectional views representing various operations in a method of fabricating a bottom-up fill dielectric material, in accordance with an embodiment of the present disclosure.

Referring to FIG. 3A, a method of fabricating a bottom-up fill dielectric material for semiconductor structure fabrication includes first forming a patterned material layer 302 above a substrate or underlying structure 300. The patterned material layer 302 includes a plurality of trenches 304 formed therein. In an embodiment, the patterned material layer 302 is a patterned hardmask layer. In an embodiment, the patterned material layer 302 is a patterned dielectric layer.

In an embodiment, the trenches 304 in the patterned material layer 302 are formed using a pitch division processing and patterning scheme. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch, e.g., to form a grating structure. Pitch division processing is then implemented as a technique to increase line density. An example of pitch halving is described in greater detail below in association with FIGS. 9A and 9B.

Figure 3B:
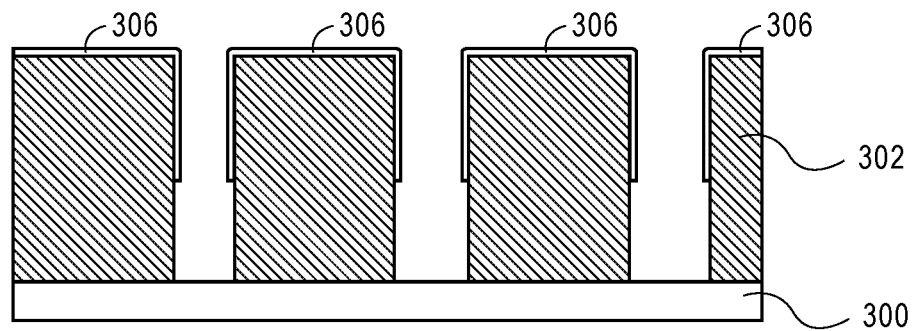

Referring to FIG. 3B, a blocking layer 306 is formed partially into trenches 304 and over surfaces of ILD layer 302 between trenches 304. In an embodiment, plasma assisted spatial ALD deposition is used to provide the desired depth control, as was described above in association with FIGS. 1 and 2.

In one embodiment, the blocking layer 306 is an ALD blocking agent, such as an aliphatic hydrocarbon with a head group that chemisorbs to the surface of trenches 304 in a self-limiting fashion. In a specific embodiment, the aliphatic hydrocarbon with the head group is selected from the group consisting of an aliphatic chlorosilane, an aminosilane with 9-10 carbons, an organophosphonic acid with 9-10 carbons. In an embodiment, self-assembled monolayer (SAMs) that attach preferentially to dielectric surfaces are used and are assembled in the vapor phase using molecules with small or long (C1-C22) alkyl chains and head groups that may include one or more of alkoxysilanes, aminosilanes or chlorosilanes. In another embodiment, in the case that passivation of metals or metal oxides is required, SAMs that attach preferentially to metal surfaces may be assembled in the vapor phase using molecules with small or long (C1-C22) alkyl chains and head groups that may include one or more of alkenes, alkynes, amines, phosphines, thiols, phosphonic acids or carboxylic acids. In another embodiment, octadecylphosphonic acid or octadecylthiol are used as passivants.

In another embodiment, the blocking layer 306 is formed using a plasma which chemically modifies the surfaces of upper portions of trenches 304. For example, in a specific embodiment, a plasma is used can render such surfaces hydrophilic or hydrophobic which can control the nucleation of a subsequent ALD process. In another specific embodiment, the plasma treatment can be used to nitridize surfaces, or to selectively remove surface-grafted species from the surfaces.

In another embodiment, the blocking layer 306 is formed using a combination of plasma treatment followed by static (e.g., low angular speed) deposition of a blocking agent. In a specific such embodiment, the plasma determines the depth of the surface modification, and the blocking agent can only chemisorb where the plasma modifies the surface. In one such embodiment, an H2 or O2 plasma is used.

Figure 3C:
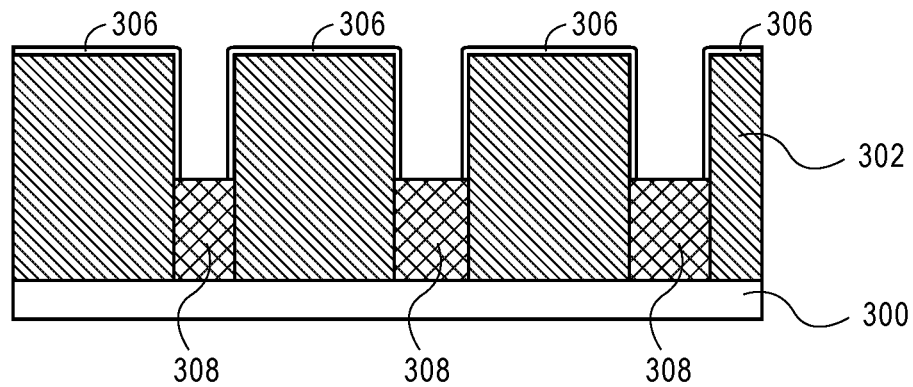

Referring to FIG. 3C, a dielectric layer 308 is formed to partially fill the trenches 304. In an embodiment, the blocking layer 306 blocks a thermal or plasma based atomic layer deposition of the dielectric layer 308, confining the deposition to a partial bottom-up fill, as described above in association with FIGS. 1 and 2.

In an embodiment, the dielectric layer 308 is or includes a thermal ALD metal oxide such as, but not limited to, HfOx, AlOx, ZrOx, TiOx, or WOx. In an embodiment, the dielectric layer 308 is or includes a material such as, but not limited to, a plasma-based ALD SiN, SiC, or SiCN layer. In an embodiment, the dielectric layer 308 is or includes doped SiOx. In an embodiment, the blocking layer 306 is removed using an ash process following deposition of the dielectric layer 308, such as an O2-plasma based ash process. In another embodiment, the blocking layer 306 is removed using thermal annealing, dry etch or wet etch. In one such embodiment, the blocking layer 306 is removed using a thermal treatment at a temperature greater than 400 degrees Celsius. In another embodiment, the blocking layer 306 is removed using a plasma or UV treatment suitable to break down an organic layer.

Figure 3D:
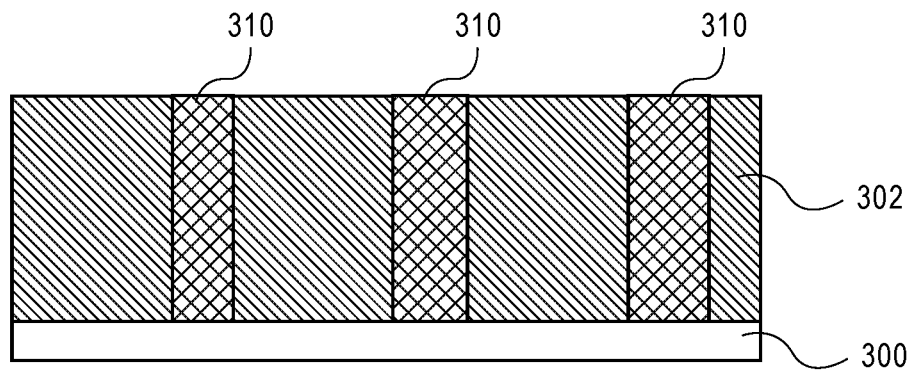

Referring to FIG. 3D, bottom-up fill of the material 308 is continued (possibly iteratively) until trenches 304 are completely or essentially completely filled to provide bottom-up fill dielectric material structures 310. In an embodiment, the dielectric material structures 310 uniformly fill up to 10:1 (height to width) aspect ratio features.

In an embodiment, as shown in FIGS. 3B-3D, a process described in association with FIGS. 1 and 2 is used to form the bottom-up fill dielectric material structures 310. In an alternative embodiment, bottom-up fill dielectric material structures 310 are formed by first depositing an accelerator on all surfaces of the trenches 304. A plasma is then used to destroy portions of the accelerator, with angular speed determining the depth of the penetrating plasma. The accelerator then remains in lower portions of the trench, facilitating a bottom-up fill process. In one such embodiment, trench surfaces are made hydrophilic, and a plasma treatment renders upper portions of the trench surface hydrophobic. In an embodiment, such an accelerator or accelerant is later removed using thermal annealing, dry etch or wet etch. In one such embodiment, such an accelerator or accelerant is later removed using a thermal treatment at a temperature greater than 400 degrees Celsius. In another embodiment, such an accelerator or accelerant is later removed using a plasma or UV treatment suitable to break down an organic layer. In an embodiment, accelerants include molecules that possess one or more reactive sites designed to react with ALD or CVD precursors. For example, in one embodiment, molecules with protic functionality such as carboxylic acids, alcohols, amines can be attached to surfaces using same head groups as described for passivants. Such protic functionalities may react quickly with organometallic and main group precursors such as Me$_3$Al, metal akoxides (e.g., Hf(OtBu)$_4$), metal amides (e.g., Ti(NMe$_2$)$_4$) etc., leading to strong nucleation and preferential deposition. Other types of accelerants can be used where Lewis basic functionality (e.g., phosphine, N-heterocyclic carbene, pyridine, amine, etc.) is appended to surface via head groups previously described. Such groups may react with metal precursors through ligand displacement reactions leading to nucleation of metal precursor at site of accelerant.

In an embodiment, the layer 302 that now includes bottom-up fill dielectric material structures 310 therein is referred to as a two-color structure because of the dual etch properties of the film, e.g., the etch properties of the hardmask or ILD 302 versus the etch properties of the bottom-up fill dielectric material structures 310. That is, filling trenches in a hardmask or dielectric layer using a bottom-up fill process to form bottom-up fill dielectric material structures 310 provides a hardmask layer having a dual etch selectivity. In an embodiment, the bottom-up fill dielectric material structures 310 of the two color system have a unique etch selectivity and good fill (e.g., no voids or seams).

The structure of FIG. 3D may be used to ultimately pattern an underlying semiconductor layer. As an example, FIG. 4 illustrates a cross-sectional view representing an operation in a method of using a bottom-up fill dielectric material for semiconductor structure manufacture, in accordance with an embodiment of the present disclosure.

Figure 4:
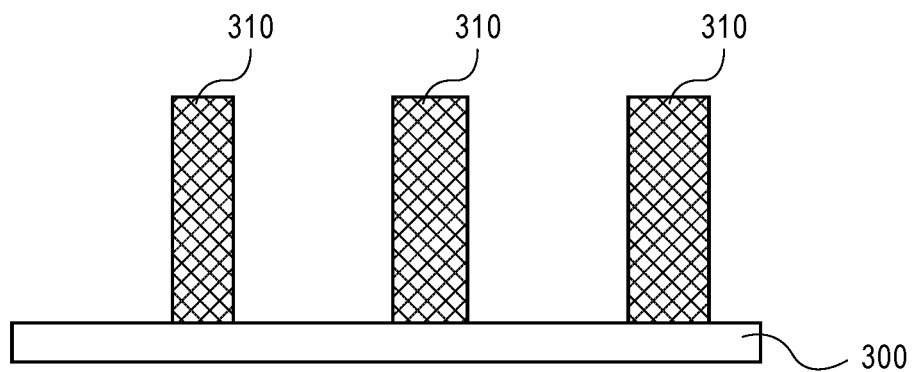
FIG. 4 illustrates a cross-sectional view representing an operation in a method of using a bottom-up fill dielectric material for semiconductor structure manufacture, in accordance with an embodiment of the present disclosure.

Referring to FIG. 4, the patterned material layer 302 is removed the selective to the bottom-up fill dielectric material structures 310. In an embodiment, the patterned material layer 302 is a patterned carbon-doped silicon oxide material and is removed using an etch process selective to the bottom-up fill dielectric material structures 310. The pattern formed by the remaining bottom-up fill dielectric material structures 310 may then be transferred to an underlying semiconductor layer (e.g., in this case, substrate 300 is a semiconductor substrate or is a substrate having a semiconductor layer thereon). Overall, the process may effectively be viewed as a negative-tone process.

As such, in an embodiment, the bottom-up fill dielectric material structures 310 is used as an etch mask for etching a semiconductor layer. In an embodiment, the bottom-up fill dielectric material structures 310 is used as an etch mask for etching a plurality of semiconductor fins in a semiconductor layer. In another embodiment, the bottom-up fill dielectric material structures 310 is used as an etch mask for etching a plurality of gate lines in a semiconductor layer. In either case, in an embodiment, the bottom-up fill dielectric material structures 310 is a sacrificial material in that it is ultimately removed.

FIGS. 5A-5D illustrate cross-sectional views representing various operations in a method of using a bottom-up fill dielectric material for semiconductor structure manufacture, in accordance with an embodiment of the present disclosure.

Figure 5A:
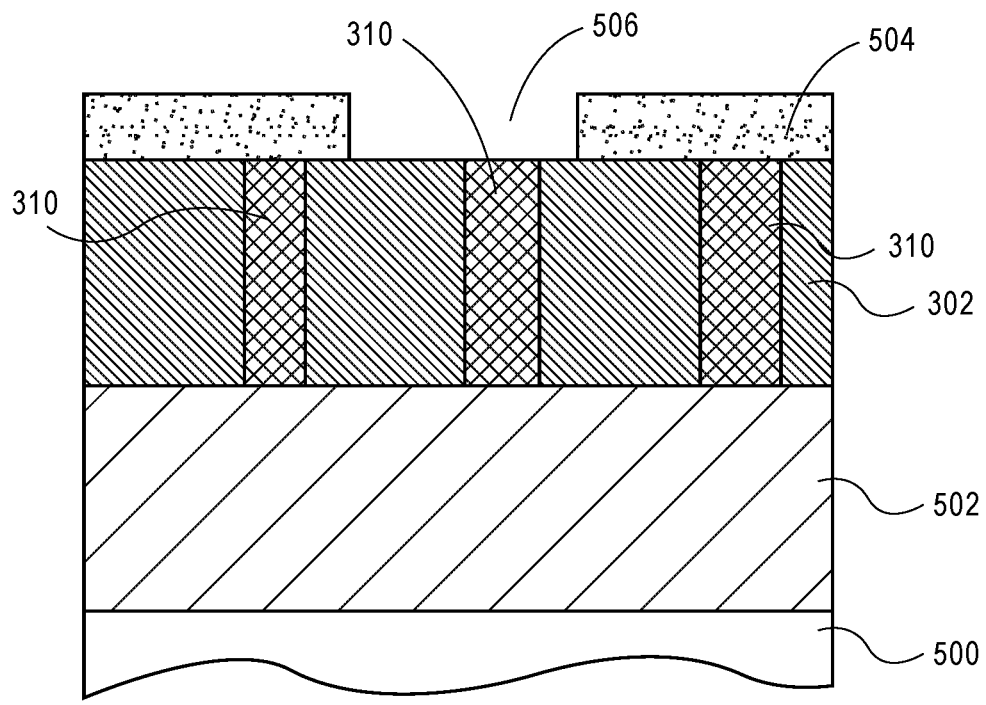
FIGS. 5A-5D illustrate cross-sectional views representing various operations in a method of using a bottom-up fill dielectric material for semiconductor structure manufacture, in accordance with an embodiment of the present disclosure.

Referring to FIG. 5A, the structure of FIG. 3D is shown having a patterned resist or hardmask layer 504 formed thereon. In an embodiment, the patterned material layer 302 is a patterned hardmask layer. Additionally, an inter-layer dielectric layer 502 is depicted above a substrate 500, below the patterned material layer 302 having the bottom-up fill dielectric material structures 310 formed in trenches therein. In an embodiment, the plurality of trenches (i.e., the locations of the bottom-up fill dielectric material structures 310) represents all possible via locations for a metallization layer.

In an embodiment, an opening 506 is formed in patterned resist or hardmask layer 504. In an embodiment, a lithographic exposure is performed to form opening 506 using a relatively large exposure window. For example, in one embodiment, a trench in the center of the exposure window is selected as a via location for ultimate clearance of a select one of the bottom-up fill dielectric material structures 310. Neighboring hardmask material (e.g., portions of 302) are exposed but are not impacted by a subsequent etch process because of the dual etch selectivity of the layer 302 and the bottom-up fill dielectric material structures 310. As such, even though the neighboring regions are exposed adjacent to one or both sides of the selected trench for via formation, those regions are not impacted by a process used to remove the select one of the bottom-up fill dielectric material structures 310 from the selected via location or locations.

Figure 5B:
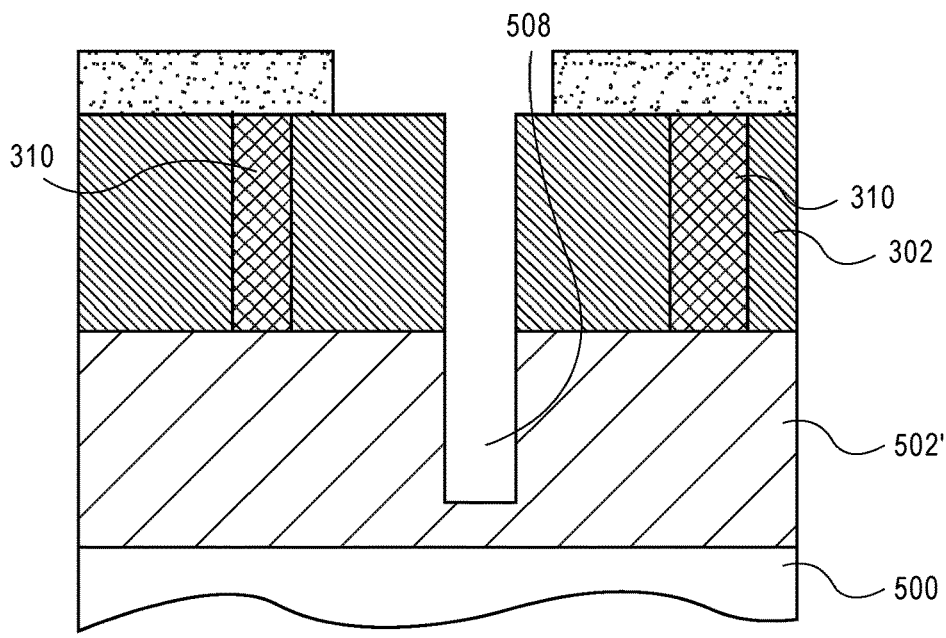

Referring to FIG. 5B, the exposed one of the bottom-up fill dielectric material structures 310 is removed. In one embodiment, the removal represents removal of the select one of the bottom-up fill dielectric material structures 310 from fewer than all of the plurality of trenches to define selected via locations for the metallization layer. The patterned hardmask layer 302 and remaining ones of the bottom-up fill dielectric material structures 310 are used as a mask to form one or more via trenches 508 in the ILD layer 502 to form once-patterned ILD layer 502'. In one embodiment, the trench 508 represents an eventual interconnect line location having an associated underlying via. Accordingly, the etch process used to form trench 508 is, in one embodiment, a via selection process based on selection and removal of one of the bottom-up fill dielectric material structures 310.

Figure 5C:
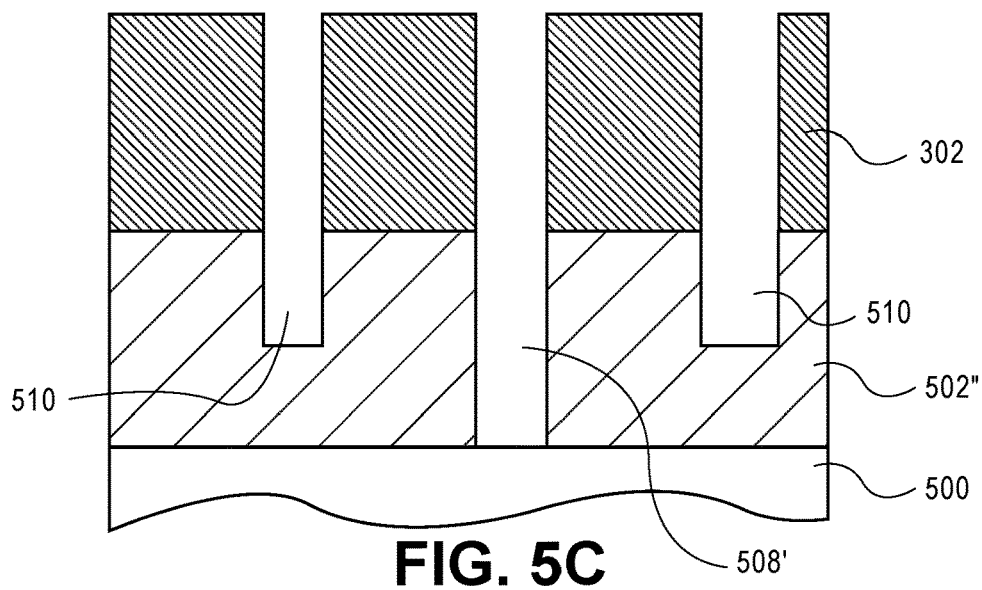

Referring to FIG. 5C, the remaining bottom-up fill dielectric material structures 310 are removed. The patterned hardmask layer 302 is then used as a mask to form line trenches 510 in the ILD layer 502' and to extend the one or more via trenches 508 to form corresponding one or more extended via trenches 508' in a twice-patterned ILD layer 502". In an embodiment, a dry etch process is used to pattern twice-patterned dielectric layer 302".

Figure 5D:
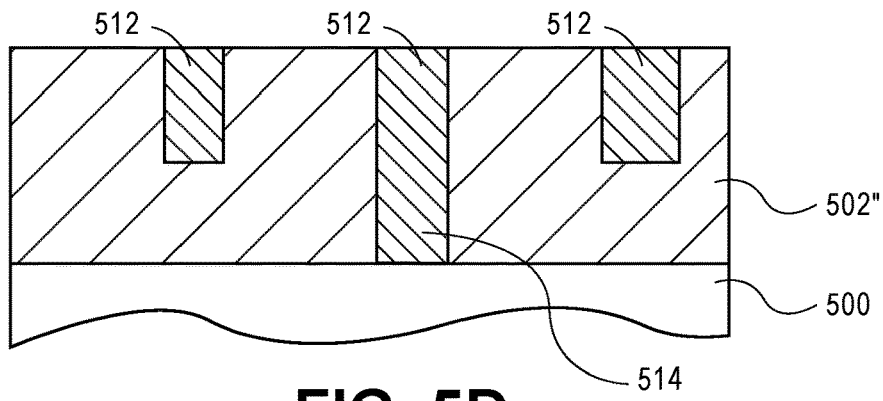

Referring to FIG. 5D, the patterned hardmask layer 302 is removed. The one or more extended via trenches 508' and the line trenches 510 are then filled with a conductive material to form a plurality of metal lines 512 and one or more underlying conductive vias 514. In an embodiment, the plurality of metal lines 512 and one or more underlying conductive vias 514 are formed by a metal deposition and subsequent planarization process.

It is to be appreciated that the resulting structure of FIG. 5D may subsequently be used as a foundation for forming subsequent metal line/via and ILD layers. Alternatively, the structure of FIG. 5D may represent the final metal interconnect layer in an integrated circuit.

It is to be appreciated that a bottom-up fill dielectric material as described herein may be retained in a final semiconductor structure, e.g., as a dielectric plug or line end. In an example, FIGS. 6A-6H illustrate portions of integrated circuit layers representing various operations in a method of using a bottom-up fill dielectric material for semiconductor structure fabrication, in accordance with another embodiment of the present disclosure. In each illustration at each described operation, an angled three-dimensional cross-section view is provided.

Figure 6A:
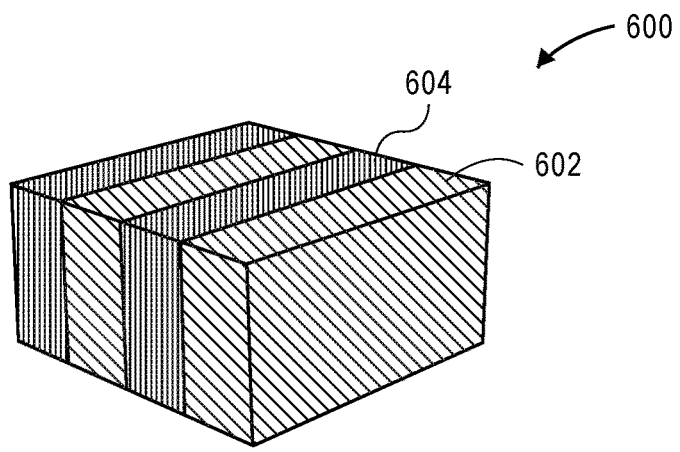
FIGS. 6A-6H illustrate portions of integrated circuit layers representing various operations in a method of using a bottom-up fill dielectric material for semiconductor structure fabrication, in accordance with another embodiment of the present disclosure.

FIG. 6A illustrates a starting point structure 600 for a subtractive via and plug process following deep metal line fabrication, in accordance with an embodiment of the present disclosure. Referring to FIG. 6A, structure 600 includes metal lines 602 with intervening interlayer dielectric (ILD) lines 604. It is to be appreciated that some of the lines 602 may be associated with underlying vias for coupling to a previous interconnect layer. In an embodiment, the metal lines 602 are formed by patterning trenches into an ILD material (e.g., the ILD material of lines 604). The trenches are then filled by metal and, if needed, planarized to the top of the ILD lines 604. In an embodiment, the metal trench and fill process involves high aspect ratio features. For example, in one embodiment, the aspect ratio of metal line height to metal line width is approximately in the range of 5-10.

Figure 6B:
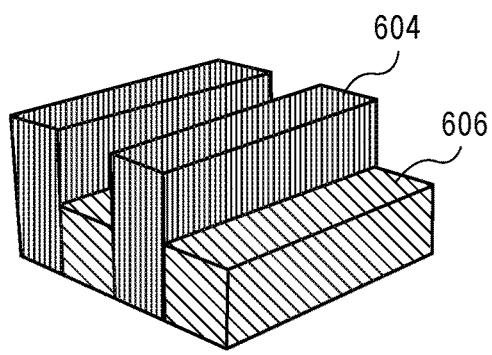

FIG. 6B illustrates the structure of FIG. 6A following recessing of the metal lines, in accordance with an embodiment of the present disclosure. Referring to FIG. 6B, the metal lines 602 are recessed selectively to provide first level metal lines 606. The recessing is performed selectively to the ILD lines 604. The recessing may be performed by etching through dry etch, wet etch, or a combination thereof. The extent of recessing may be determined by the targeted thickness of the first level metal lines 606 for use as suitable conductive interconnect lines within a back end of line (BEOL) interconnect structure.

Figure 6C:
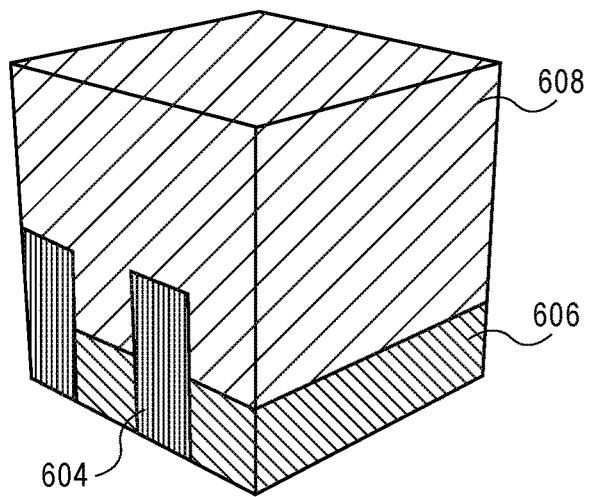

FIG. 6C illustrates the structure of FIG. 6B following formation of an interlayer dielectric (ILD) layer, in accordance with an embodiment of the present disclosure. Referring to FIG. 6C, an ILD material layer 608 is deposited and, if necessary, planarized, to a level above the recessed metal lines 606 and the ILD lines 604.

Figure 6D:
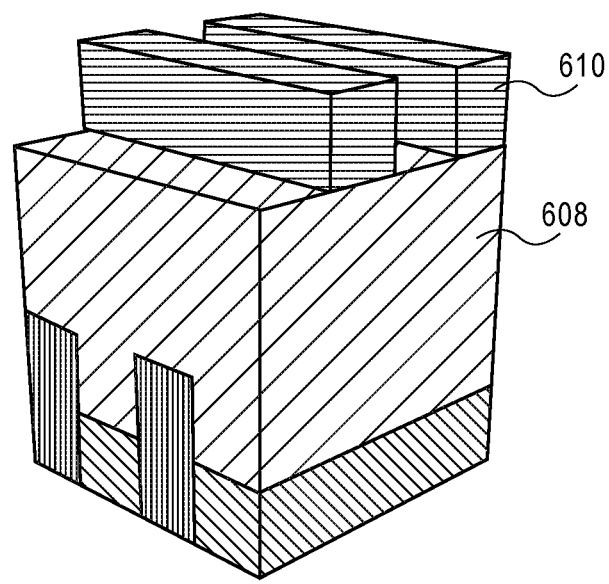

FIG. 6D illustrates the structure of FIG. 6C following deposition and patterning of a hardmask layer, in accordance with an embodiment of the present disclosure. Referring to FIG. 6D a hardmask layer 610 is formed on the ILD layer 608. In one such embodiment, the hardmask layer 610 is formed with a grating pattern orthogonal to the grating pattern of the first level metal lines 606/ILD lines 604, as is depicted in FIG. 6D. In an embodiment, the grating structure formed by the hardmask layer 610 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 610 of FIG. 6D may have hardmask lines spaced at a constant pitch and having a constant width.

Figure 6E:
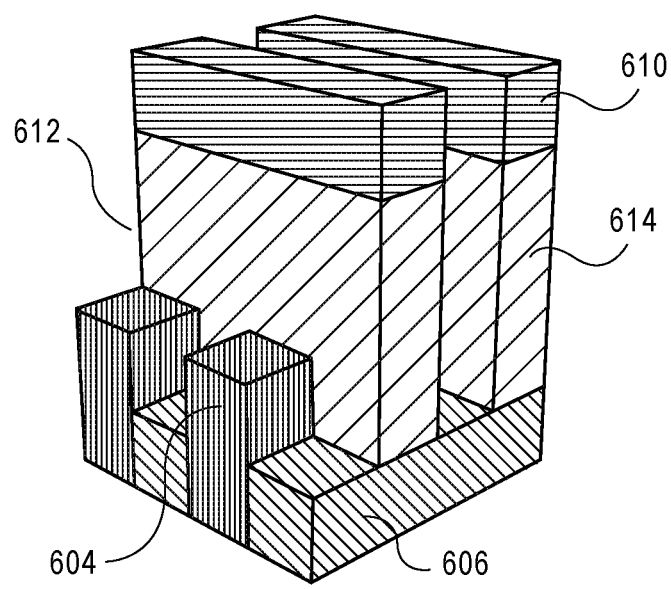

FIG. 6E illustrates the structure of FIG. 6D following trench formation defined using the pattern of the hardmask of FIG. 6D, in accordance with an embodiment of the present disclosure. Referring to FIG. 6E, the exposed regions (i.e., unprotected by 610) of the ILD layer 608 are etched to form trenches 612 and patterned ILD layer 614. The etch stops on, and thus exposes, the top surfaces of the first level metal lines 606 and the ILD lines 604.

Figure 6F:
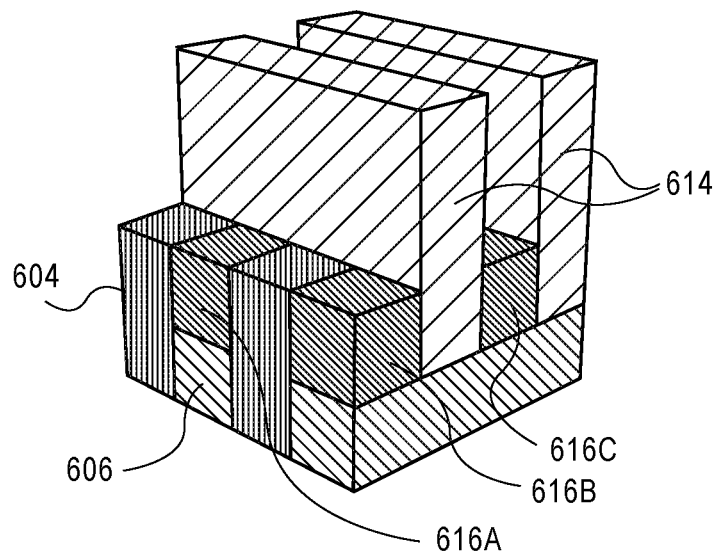

FIG. 6F illustrates the structure of FIG. 6E following a bottom-up fill dielectric material formation process, in accordance with an embodiment of the present disclosure. Referring to FIG. 6F, bottom-up fill dielectric material structures 616A, 616B and 616C are formed in possible via locations above exposed portions of the recessed metal lines 606. The bottom-up fill dielectric material structures 616A, 616B and 616C are formed laterally adjacent to the ILD lines 604. Additionally, referring again to FIG. 6F, the hardmask layer 610 may be removed from the patterned ILD layer 614. In an embodiment, the bottom-up fill dielectric material structures 616A, 616B and 616C are formed using a similar process and/or a similar material as described in association with bottom-up fill dielectric material structures 310.

Figure 6G:
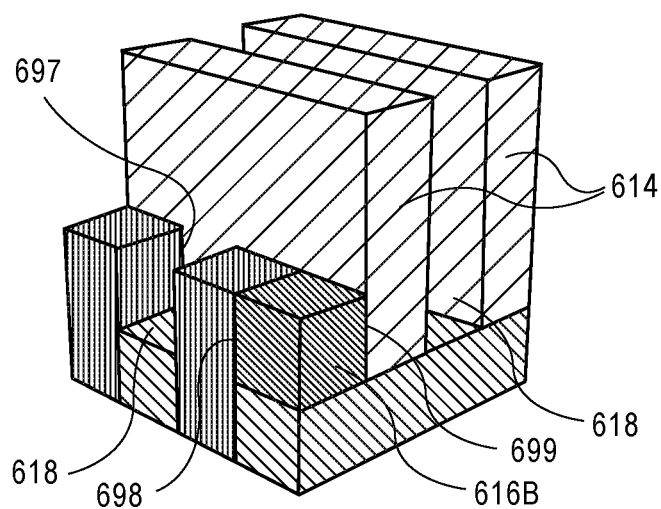

FIG. 6G illustrates the structure of FIG. 6F following removal of select ones of the bottom-up fill dielectric material structures 616A, 616B and 616C to reveal selected via locations. For example, bottom-up fill dielectric material structures 616A and 616C are removed in select via locations. On the other hand, remaining bottom-up fill dielectric material structure 616B is retained in locations not selected for via formation. In an embodiment, the etch characteristics of the bottom-up fill dielectric material structures 616A and 616C enable highly selective removal of the bottom-up fill dielectric material structures 616A and 616C relative to the ILD lines 604 and the ILD lines 614. In one such embodiment, the difference in etch characteristics between the bottom-up fill dielectric material structures 616A and 616C relative to the ILD lines 604 and the ILD lines 614 enables use of a wider or more relaxed lithographic process, allowing for some overlap and exposure of portions of the ILD lines 604 and/or the ILD lines 614.

Referring again to FIG. 6G, in an embodiment, the resulting structure includes up to three different dielectric material regions (ILD lines 604+ILD lines 614+bottom-up fill dielectric material structure 616B) in a single plane of the metallization structure. In one such embodiment, the ILD lines 604 and ILD lines 614 are composed of a same material. In another such embodiment, the ILD lines 604, and the ILD lines 614 are composed of different ILD materials. In either case, the remaining bottom-up fill dielectric material structure 616B is composed of a bottom-up fill dielectric material, examples of which are described above, and is different from the material of the ILD lines 604 and the ILD lines 614. In a specific embodiment, a distinction such as a vertical seam between the materials of ILD lines 604 and ILD lines 614 (e.g., seam 697) and/or between ILD lines 604 and the bottom-up fill dielectric material structure 616B (e.g., seam 698) and/or between ILD lines 614 and the bottom-up fill dielectric material structure 616B (e.g., seam 699) is observed in the final structure.

Figure 6H:
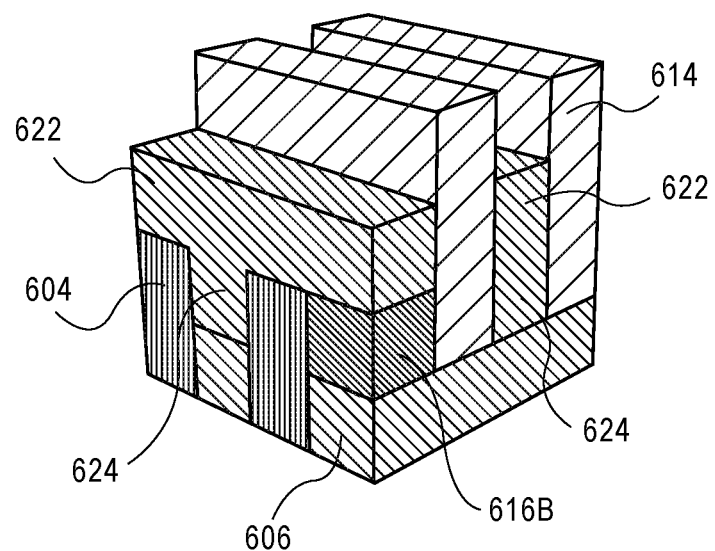

FIG. 6H illustrates the structure of FIG. 6G following metal line and via formation, in accordance with an embodiment of the present disclosure. Referring to FIG. 6H, metal lines 622 and vias 624 are formed upon metal fill of the openings of FIG. 6G. The metal lines 622 are coupled to the underlying metal lines 606 by the vias 624. In an embodiment, the openings are filled in a damascene approach or a bottom-up fill approach to provide the structure shown in FIG. 6H. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 614 may be removed to provide air gaps between the resulting metal lines 624.

In an embodiment, the remaining bottom-up fill dielectric material structure 616B is retained in the final structure, as is depicted in FIG. 6H. The remaining bottom-up fill dielectric material structure 616B may effectively provide a plug or dielectric plug in the final structure, where non-conductive spaces or interruptions between metal lines are referred to as "plugs," "dielectric plugs" or "metal line ends" among the metal lines of back end of line (BEOL) metal interconnect structures.

Figure 7:
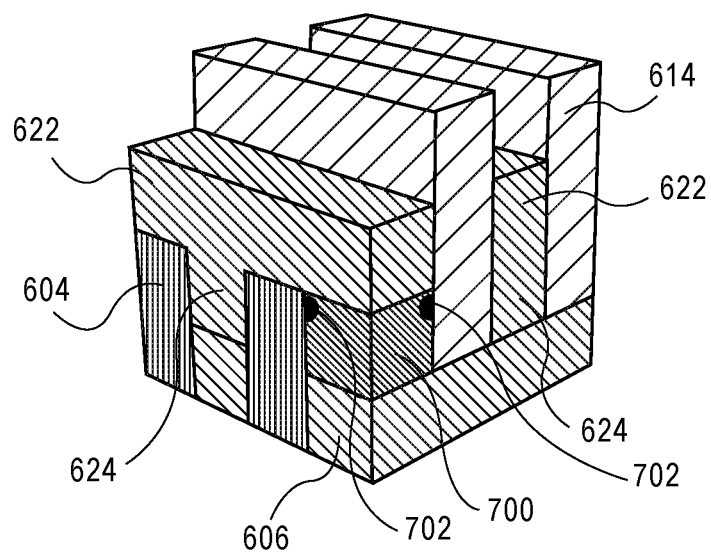
FIG. 7 illustrates a portion of an integrated circuit layer including a bottom-up fill dielectric material having trapped blocking layer portions therein, in accordance with another embodiment of the present disclosure.

It is to be appreciated that, in the case that the remaining bottom-up fill dielectric material structure 616B is retained in the final structure, artifacts may be retained with the dielectric material structure 616B. In a first example, FIG. 7 illustrates a portion of an integrated circuit layer including a bottom-up fill dielectric material having trapped blocking layer portions therein, in accordance with another embodiment of the present disclosure.

As described in association with FIGS. 1 and 2 a blocking layer used to direct a bottom-up fill process may be removed by an ash process. It may be the case that toward the end of an iterative filling process (repeated cycles of blocking layer deposition, dielectric fill, and blocking layer removal), portions of the blocking layer may be trapped in the final dielectric material structure. Referring to FIG. 7, the remaining bottom-up fill dielectric material structure 616B includes blocking layer portions 702 trapped therein. In an embodiment, in the case that remaining bottom-up fill dielectric material structure 616B is retained in the final structure, the blocking layer portions 702 are retained in the final structure. In an embodiment, the blocking layer portions 702 are composed of a material described above in association with blocking layer 306. In an embodiment, the remaining bottom-up fill dielectric material structure 616B is composed of a material described above in association with dielectric material 308/310.

Figure 8:
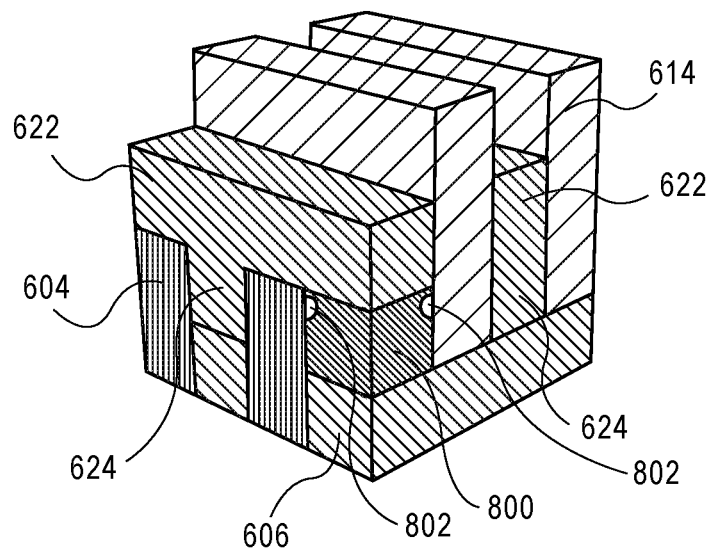
FIG. 8 illustrates a portion of an integrated circuit layer including a bottom-up fill dielectric material having trapped voids therein, in accordance with another embodiment of the present disclosure.

In a second example, FIG. 8 illustrates a portion of an integrated circuit layer including a bottom-up fill dielectric material having trapped voids therein, in accordance with another embodiment of the present disclosure.

As described in association with FIGS. 1 and 2 a blocking layer used to direct a bottom-up fill process may be removed by an ash process. It may be the case that toward the end of an iterative filling process (repeated cycles of blocking layer deposition, dielectric fill, and blocking layer removal), portions of the blocking layer may be trapped in the dielectric material structure. An ash process then removes the trapped portions of the blocking layer after the dielectric material has already been formed around those blocking layer portions. The ash process leaves one or more voids in the dielectric material. Referring to FIG. 8, the remaining bottom-up fill dielectric material structure 616B includes voids 802 trapped therein. In an embodiment, in the case that remaining bottom-up fill dielectric material structure 616B is retained in the final structure, the voids 802 are retained in the final structure. In an embodiment, the remaining bottom-up fill dielectric material structure 616B is composed of a material described above in association with dielectric material 308/310.

The structure of FIG. 6H, FIG. 7 or FIG. 8 may subsequently be used as a foundation for forming subsequent metal line/via and ILD layers. Alternatively, the structure of FIG. 6H may represent the final metal interconnect layer in an integrated circuit. It is to be appreciated that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithography/dual damascene patterning that must otherwise be tolerated, is not a factor for the resulting structures described herein. Referring again to FIG. 6H, then, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

In an embodiment, the term "grating structure" for metal lines, ILD lines or hardmask lines is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a constant pitch and having a constant width. The pattern may be fabricated by a pitch halving or pitch quartering, or other pitch division, approach.

Figure 9A:
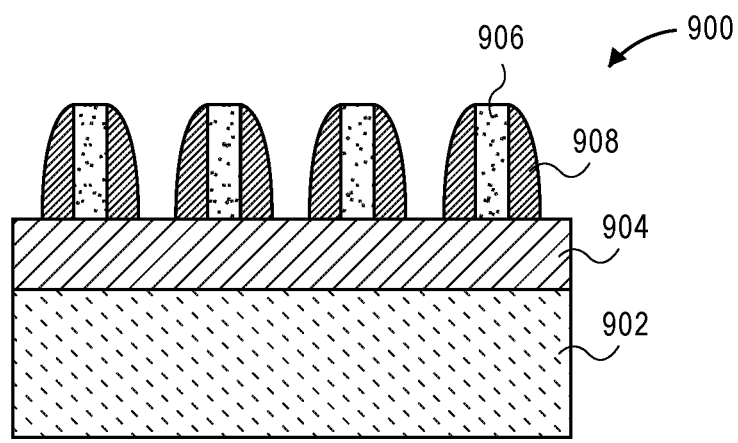
FIG. 9A illustrates a cross-sectional view of a starting structure following deposition, but prior to patterning, of a hardmask material layer formed on an interlayer dielectric (ILD) layer, in accordance with another embodiment of the present disclosure.
Figure 9B:
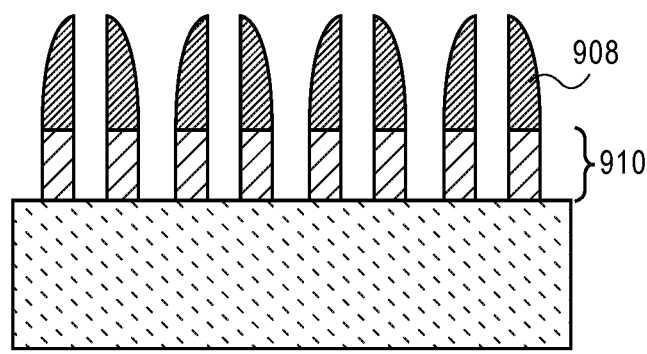
FIG. 9B illustrates a cross-sectional view of the structure of FIG. 9A following patterning of the hardmask layer by pitch halving.

In an example, pitch halving can be implemented to double the line density of a fabricated grating structure. FIG. 9A illustrates a cross-sectional view of a starting structure following deposition, but prior to patterning, of a hardmask material layer formed on an interlayer dielectric (ILD) layer. FIG. 9B illustrates a cross-sectional view of the structure of FIG. 9A following patterning of the hardmask layer by pitch halving.

Referring to FIG. 9A, a starting structure 900 has a hardmask material layer 904 formed on an interlayer dielectric (ILD) layer 902. A patterned mask 906 is disposed above the hardmask material layer 904. The patterned mask 906 has spacers 908 formed along sidewalls of features (lines) thereof, on the hardmask material layer 904.

Referring to FIG. 9B, the hardmask material layer 904 is patterned in a pitch halving approach. Specifically, the patterned mask 906 is first removed. The resulting pattern of the spacers 908 has double the density, or half the pitch or the features of the mask 906. The pattern of the spacers 908 is transferred, e.g., by an etch process, to the hardmask material layer 904 to form a patterned hardmask 910, as is depicted in FIG. 9B. In one such embodiment, the patterned hardmask 910 is formed with a grating pattern having unidirectional lines. The grating pattern of the patterned hardmask 910 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 910 of FIG. 9B may have hardmask lines spaced at a constant pitch and having a constant width relative to one another. The dimensions achieved may be far smaller than the critical dimension of the lithographic technique employed.

Accordingly, for either FEOL or BEOL, or both, integrations schemes, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

It is to be appreciated that the layers and materials described above are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted above may be fabricated on underlying lower level back end of line (BEOL) interconnect layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
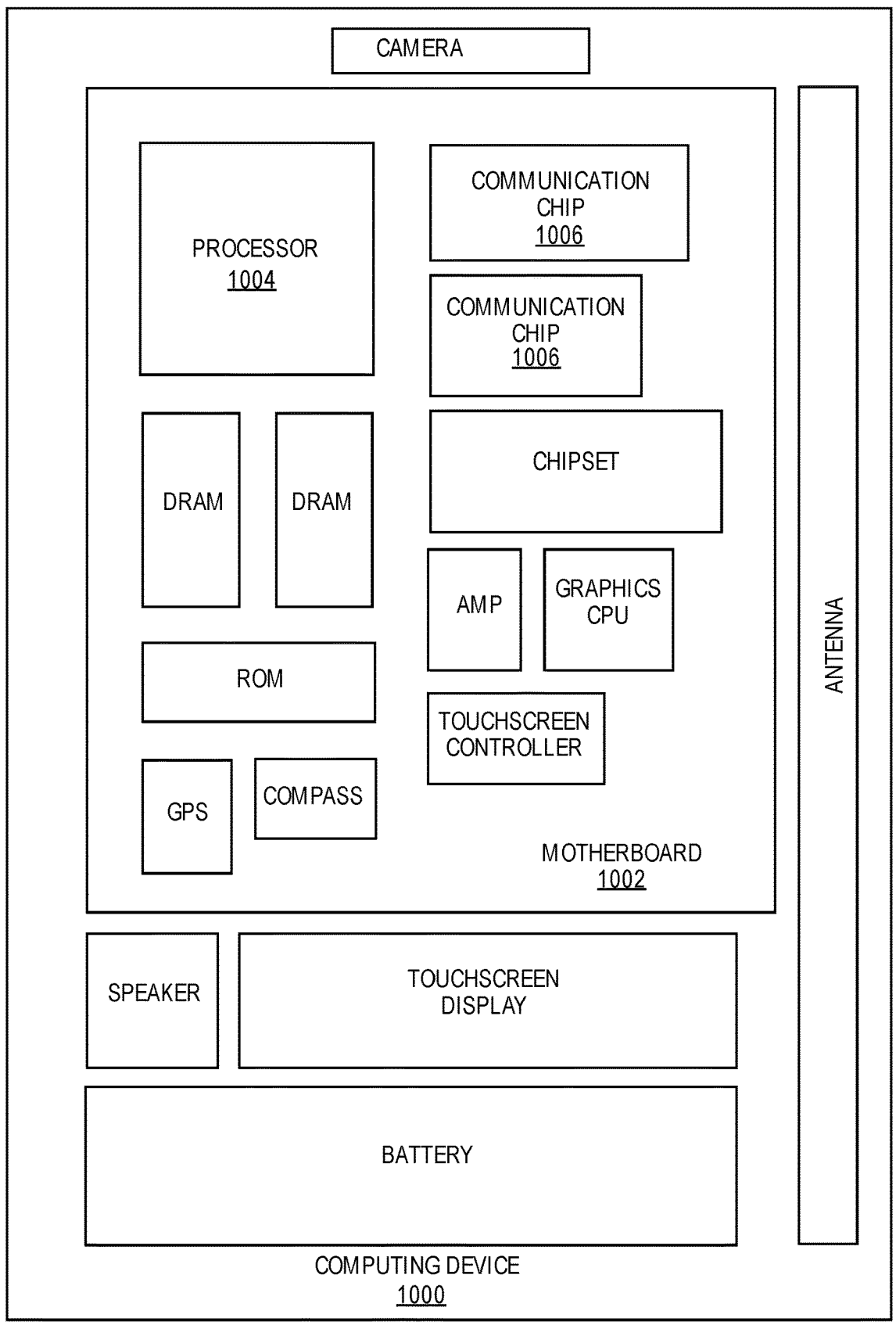
FIG. 10 illustrates a computing device in accordance with one implementation of an embodiment of the disclosure.

FIG. 10 illustrates a computing device 1000 in accordance with one implementation of an embodiment of the disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In an embodiment, the integrated circuit die of the processor includes or is fabricated using a bottom-up fill dielectric material as described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In an embodiment, the integrated circuit die of the communication chip includes or is fabricated using a bottom-up fill dielectric material as described herein.

In further implementations, another component housed within the computing device 1000 may contain an integrated circuit die that includes or is fabricated using a bottom-up fill dielectric material as described herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
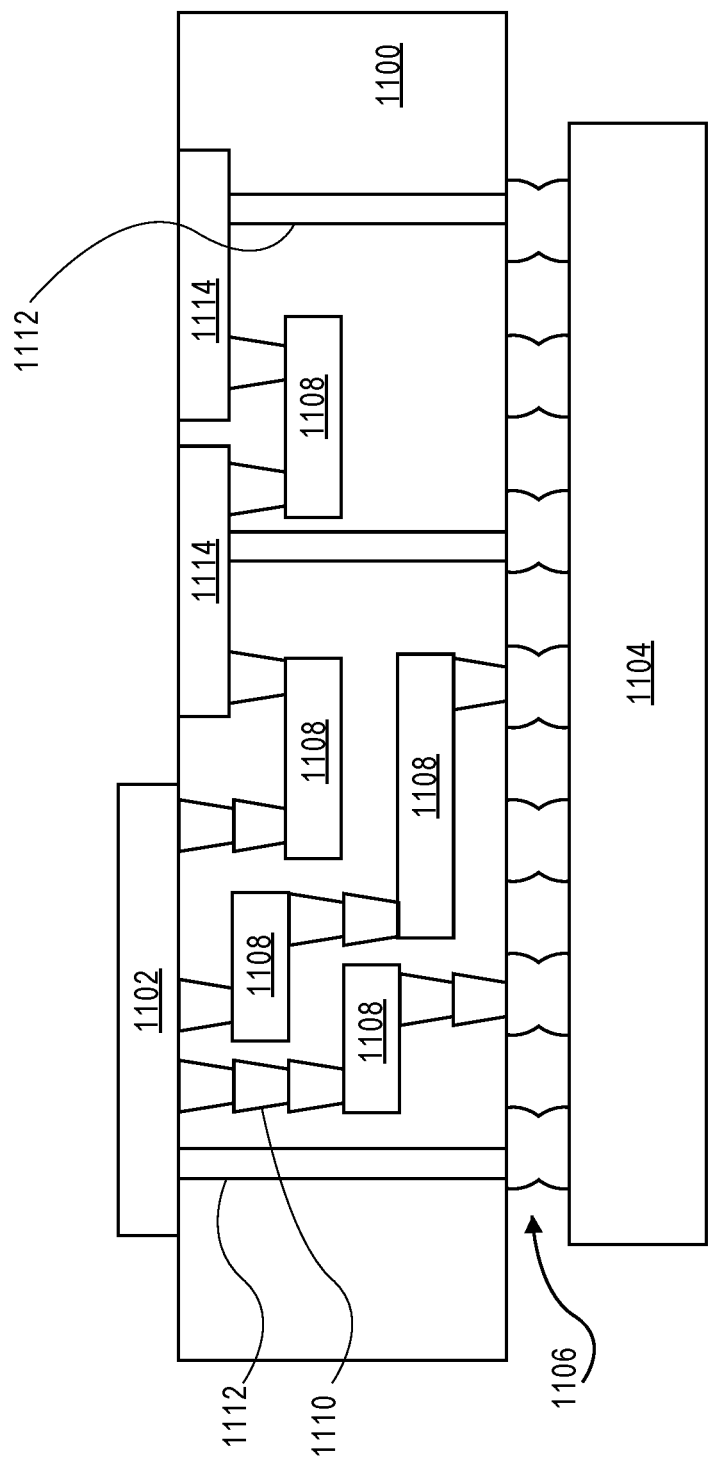
FIG. 11 is an interposer implementing one or more embodiments of the disclosure.

FIG. 11 illustrates an interposer 1100 that includes one or more embodiments of the disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100.

Thus, embodiments of the present disclosure include bottom-up fill dielectric materials for semiconductor structure fabrication, and methods of fabricating bottom-up fill dielectric materials for semiconductor structure fabrication.

Example embodiment 1: A method of fabricating a dielectric material for semiconductor structure fabrication includes forming a trench in a material layer above a substrate. A blocking layer is formed partially into the trench along upper portions of sidewalls of the trench. A dielectric layer is formed filling a bottom portion of the trench with a dielectric material up to the blocking layer. The blocking layer is removed. The forming the blocking layer, the forming the dielectric layer, and the removing the blocking layer are repeated until the trench is completely filled with the dielectric material.

Example embodiment 2: The method of example embodiment 1, wherein forming the blocking layer includes spinning the substrate to provide the trench having an angular speed during the forming.

Example embodiment 3: The method of example embodiment 2, wherein the angular speed is increased during each iteration of the forming the blocking layer.

Example embodiment 4: The method of example embodiment 1, 2 or 3, wherein forming the blocking layer includes forming an aliphatic hydrocarbon using atomic layer deposition (ALD), the aliphatic hydrocarbon having a head group that chemisorbs to the upper portions of the sidewalls of the trench.

Example embodiment 5: The method of example embodiment 1, 2 or 3, wherein forming the blocking layer includes chemically modifying a surface of the trench using a plasma.

Example embodiment 6: The method of example embodiment 1, 2, 3, 4 or 5, wherein forming the dielectric layer includes forming a metal oxide material using a thermal atomic later deposition (ALD) process.

Example embodiment 7: The method of example embodiment 1, 2, 3, 4, 5 or 6, wherein removing the blocking layer includes using an ash process.

Example embodiment 8: A method of fabricating a metallization layer for a semiconductor structure includes forming a plurality of trenches in a hardmask layer above an inter-layer dielectric (ILD) layer above a substrate to form a patterned hardmask layer, the plurality of trenches representing all possible via locations for the metallization layer. The plurality of trenches is filled with a bottom-up fill dielectric material. The bottom-up fill dielectric material is removed from fewer than all of the plurality of trenches to define selected via locations for the metallization layer.

Example embodiment 9: The method of example embodiment 8, wherein filling the plurality of trenches with the bottom-up fill dielectric material includes using plasma assisted spatial atomic layer deposition (ALD).

Example embodiment 10: The method of example embodiment 8 or 9, further including using the patterned hardmask layer and remaining portions of the bottom-up fill dielectric material as a mask to form one or more via trenches in the ILD layer.

Example embodiment 11: The method of example embodiment 10, further including removing the remaining portions of the bottom-up fill dielectric material, using the patterned hardmask layer as a mask to form line trenches in the ILD layer and to extend the one or more via trenches to form corresponding one or more extended via trenches, removing the patterned hardmask layer, and filling the one or more extended via trenches and the line trenches with a conductive material to form a plurality of metal lines and one or more underlying conductive vias.

Example embodiment 12: A method of patterning a layer for a semiconductor structure includes forming a plurality of trenches in a dielectric layer above a semiconductor layer above a substrate to form a patterned dielectric layer. The plurality of trenches is filled with a bottom-up fill dielectric material. The patterned dielectric layer is removed selective to the bottom-up fill dielectric material. The bottom-up fill dielectric material is used to pattern the semiconductor layer.

Example embodiment 13: The method of example embodiment 12, wherein filling the plurality of trenches with the bottom-up fill dielectric material includes using plasma assisted spatial atomic layer deposition (ALD).

Example embodiment 14: The method of example embodiment 12 or 13, wherein using the bottom-up fill dielectric material to pattern the semiconductor layer includes forming a plurality of semiconductor fins in the semiconductor layer.

Example embodiment 15: An interconnect structure for an integrated circuit includes a first layer of the interconnect structure disposed above a substrate, the first layer including a first grating of alternating metal lines and dielectric lines in a first direction, wherein the dielectric lines have an uppermost surface higher than an uppermost surface of the metal lines. A second layer of the interconnect structure is disposed above the first layer of the interconnect structure, the second layer including a second grating of alternating metal lines and dielectric lines in a second direction, perpendicular to the first direction, wherein the dielectric lines have a lowermost surface lower than a lowermost surface of the metal lines of the second grating, wherein the dielectric lines of the second grating overlap and contact, but are distinct from, the dielectric lines of the first grating. A region of dielectric material is disposed between the metal lines of the first grating and the metal lines of the second grating, and in a same plane as upper portions of the dielectric lines of the first grating and lower portions of the dielectric lines of the second grating, the region of dielectric material including a bottom-up fill dielectric material.

Example embodiment 16: The method of example embodiment 15, wherein the bottom-up fill dielectric material includes a void trapped therein.

Example embodiment 17: The method of example embodiment 15, wherein the bottom-up fill dielectric material includes a blocking layer trapped therein, the blocking layer distinct from the bottom-up fill dielectric material.

Example embodiment 18: The method of example embodiment 17, wherein the blocking layer includes an aliphatic hydrocarbon having a head group.

Example embodiment 19: The method of example embodiment 15, 16, 17 or 18, wherein the bottom-up fill dielectric material includes a metal oxide.

Example embodiment 20: The method of example embodiment 15, 16, 17, 18 or 19, further including a conductive via disposed between and coupling a metal line of the first grating to a metal line of the second grating, the conductive via in the same plane as the region of dielectric material.

Example embodiment 21: The method of example embodiment 15, 16, 17, 18, 19 or 20, wherein the dielectric lines of the first grating include a first dielectric material, and the dielectric lines of the second grating include a second, different dielectric material, and wherein the first and second dielectric materials are different than the region of dielectric material including the bottom-up fill dielectric material.

What is claimed is:

1. A method of fabricating a dielectric material for semiconductor structure fabrication, the method comprising:
   forming a trench in a material layer above a substrate;
   forming a blocking layer partially into the trench along upper portions of sidewalls of the trench;
   forming a dielectric layer filling a bottom portion of the trench with a dielectric material up to the blocking layer;
   removing the blocking layer; and
   repeating the forming the blocking layer, the forming the dielectric layer, and the removing the blocking layer until the trench is completely filled with the dielectric material.

2. The method of claim 1, wherein forming the blocking layer comprises spinning the substrate to provide the trench having an angular speed during the forming.

3. The method of claim 2, wherein the angular speed is increased during each iteration of the forming the blocking layer.

4. The method of claim 1, wherein forming the blocking layer comprises forming an aliphatic hydrocarbon using atomic layer deposition (ALD), the aliphatic hydrocarbon having a head group that chemisorbs to the upper portions of the sidewalls of the trench.

5. The method of claim 1, wherein forming the blocking layer comprises chemically modifying a surface of the trench using a plasma.

6. The method of claim 1, wherein forming the dielectric layer comprises forming a metal oxide material using a thermal atomic later deposition (ALD) process.

7. The method of claim 1, wherein removing the blocking layer comprises using an ash process.

8. A method of fabricating a metallization layer for a semiconductor structure, the method comprising:
   forming a plurality of trenches in a hardmask layer above an inter-layer dielectric (ILD) layer above a substrate to form a patterned hardmask layer, the plurality of trenches representing all possible via locations for the metallization layer;
   filling the plurality of trenches with a bottom-up fill dielectric material, the bottom-up fill dielectric material having an uppermost surface at a same level as an uppermost surface of the hardmask layer; and
   removing the bottom-up fill dielectric material from fewer than all of the plurality of trenches to define selected via locations for the metallization layer.

9. The method of claim 8, wherein filling the plurality of trenches with the bottom-up fill dielectric material comprises using plasma assisted spatial atomic layer deposition (ALD).

10. The method of claim 8, further comprising:
    using the patterned hardmask layer and remaining portions of the bottom-up fill dielectric material as a mask to form one or more via trenches in the ILD layer.

11. The method of claim 10, further comprising:
    removing the remaining portions of the bottom-up fill dielectric material;
    using the patterned hardmask layer as a mask to form line trenches in the ILD layer and to extend the one or more via trenches to form corresponding one or more extended via trenches;
    removing the patterned hardmask layer; and
    filling the one or more extended via trenches and the line trenches with a conductive material to form a plurality of metal lines and one or more underlying conductive vias.

12. A method of patterning a layer for a semiconductor structure, the method comprising:
    forming a plurality of trenches in a dielectric layer above a semiconductor layer above a substrate to form a patterned dielectric layer;
    filling the plurality of trenches with a bottom-up fill dielectric material, the bottom-up fill dielectric material having an uppermost surface at a same level as an uppermost surface of the patterned dielectric layer;
    removing the patterned dielectric layer selective to the bottom-up fill dielectric material; and
    using the bottom-up fill dielectric material to pattern the semiconductor layer.

13. The method of claim 12, wherein filling the plurality of trenches with the bottom-up fill dielectric material comprises using plasma assisted spatial atomic layer deposition (ALD).

14. The method of claim 12, wherein using the bottom-up fill dielectric material to pattern the semiconductor layer comprises forming a plurality of semiconductor fins in the semiconductor layer.

15. A method of fabricating an integrated circuit structure, the method comprising:
    forming a first layer of an interconnect structure disposed above a substrate, the first layer comprising a first grating of alternating metal lines and dielectric lines in a first direction, wherein the dielectric lines of the first grating have an uppermost surface higher than an uppermost surface of the metal lines of the first grating;
    forming a second layer of the interconnect structure disposed above the first layer of the interconnect structure, the second layer comprising a second grating of alternating metal lines and dielectric lines in a second direction, perpendicular to the first direction, wherein the dielectric lines of the second grating have a lowermost surface lower than a lowermost surface of the metal lines of the second grating, wherein the dielectric lines of the second grating overlap and contact, but are distinct from, the dielectric lines of the first grating; and forming a region of dielectric material disposed between a metal line of the metal lines of the first grating and a metal line of the metal lines of the second grating, and in a same plane as upper portions of the dielectric lines of the first grating and lower portions of the dielectric lines of the second grating, the region of dielectric material comprising a bottom-up fill dielectric material and a blocking layer, the blocking layer separate and distinct from the bottom-up fill dielectric material, and the blocking layer comprising a material different than the bottom-up fill dielectric material.

16. The method of claim 15, wherein the bottom-up fill dielectric material comprises a void trapped therein.

17. The method of claim 15, wherein the blocking layer comprises an aliphatic hydrocarbon having a head group.

18. The method of claim 15, wherein the bottom-up fill dielectric material comprises a metal oxide.

19. The method of claim 15, further comprising:

forming a conductive via disposed between and coupling a metal line of the first grating to a metal line of the second grating, the conductive via in the same plane as the region of dielectric material.

20. The method of claim 15, wherein the dielectric lines of the first grating comprise a first dielectric material, and the dielectric lines of the second grating comprise a second, different, dielectric material, and wherein the first dielectric material and the second, different, dielectric material are different in composition than the region of dielectric material.

* * * * *